(12) United States Patent
Lee et al.

(10) Patent No.: US 7,955,784 B2
(45) Date of Patent: *Jun. 7, 2011

(54) PHOTORESIST COMPOSITION AND METHOD OF MANUFACTURING A THIN-FILM TRANSISTOR SUBSTRATE USING THE SAME

(75) Inventors: Hi-Kuk Lee, Yongin-si (KR); Woo-Seok Jeon, Seoul (KR); Doo-Hee Jung, Seoul (KR); Jeong-Min Park, Seoul (KR); Deok-Man Kang, Seongnam-si (KR); Si-Young Jung, Hanam-si (KR); Jae-Young Choi, Suwon-si (KR)

(73) Assignees: Samsung Electronics Co., Ltd. (KR); AZ Electronic Materials (Japan) K.K. (JP)

( * ) Notice: Subject to any disclaimer, the term of this patent is extended or adjusted under 35 U.S.C. 154(b) by 165 days.

This patent is subject to a terminal disclaimer.

(21) Appl. No.: 11/554,194

(22) Filed: Oct. 30, 2006

(65) Prior Publication Data

US 2007/0259272 A1 Nov. 8, 2007

(30) Foreign Application Priority Data

Oct. 31, 2005 (KR) ........................ 10-2005-0102942

(51) Int. Cl.
*G03F 7/30* (2006.01)
(52) U.S. Cl. ........ 430/313; 430/191; 430/192; 430/193; 430/316; 430/317; 430/318; 430/326; 438/148; 438/149; 438/155; 438/161

(58) Field of Classification Search .................. 430/191, 430/192, 193, 313, 316, 317, 318, 326; 438/148, 438/149, 155, 161
See application file for complete search history.

(56) References Cited

U.S. PATENT DOCUMENTS

| 6,641,972 | B2 * | 11/2003 | Misumi et al. ................. 430/192 |
| 7,291,439 | B2 * | 11/2007 | Park et al. ...................... 430/191 |
| 2006/0027804 | A1 * | 2/2006 | Yamazaki et al. ............... 257/59 |
| 2006/0188806 | A1 * | 8/2006 | Lee et al. .................... 430/270.1 |
| 2007/0196962 | A1 * | 8/2007 | Morisue et al. ............... 438/149 |

FOREIGN PATENT DOCUMENTS

JP 2001-215696 2/2000

* cited by examiner

*Primary Examiner* — John S Chu
(74) *Attorney, Agent, or Firm* — Cantor Colburn LLP

(57) ABSTRACT

A photoresist composition includes about 100 parts by weight of resin mixture including novolak resin and acryl resin and about 10 parts to about 50 parts by weight of naphthoquinone diazosulfonic acid ester. A weight-average molecular weight of the novolak resin is no less than about 30,000. A weight-average molecular weight of the acryl resin is no less than about 20,000. The acryl resin makes up about 1% to about 15% of the total weight of the resin mixture. When a photoresist film formed using the photoresist composition is heated, a profile variation of the photoresist composition is relatively small. Therefore, a residual photoresist film has a uniform thickness, and a short circuit and/or an open defect in a TFT substrate may be reduced.

4 Claims, 17 Drawing Sheets

PHOTORESIST COMPOSITION AND METHOD OF MANUFACTURING A THIN-FILM TRANSISTOR SUBSTRATE USING THE SAME

This application claims priority to Korean Patent Application No. 2005-102942, filed on Oct. 31, 2005, and all the benefits accruing therefrom under 35 U.S.C. §119, the contents of which in its entirety are herein incorporated by reference.

BACKGROUND OF THE INVENTION

1. Field of the Invention

The present invention relates to a photoresist composition and a method of manufacturing a thin-film transistor substrate using the photoresist composition. More particularly, the present invention relates to a photoresist composition having a relatively high heat-resistance to reduce a profile variation of a photoresist film formed using the photoresist composition when heated, and a method of manufacturing a thin-film transistor substrate using the photoresist composition.

2. Description of the Related Art

In general, a liquid crystal display apparatus is manufactured through a five-mask process. However, a four-mask process has been developed in order to reduce manufacturing costs and to improve manufacturing efficiency. The four-mask process involves double etching a photoresist film. In the four-mask process, it is preferable that a profile of a photoresist film formed by coating a photoresist composition on a substrate be made relatively large in order to easily progress the four-mask process. When the photoresist film has a smaller profile, as when it is made relatively thin on the substrate, the four-mask process has less room for error as the first etching must be performed precisely to avoid excess removal of the photo resist film. When the profile of the photoresist film is relatively large, a design margin is reduced, and an etching process may be more easily performed. When a photoresist pattern formed from a conventional photoresist composition is heated at a temperature of no less than about 125° C., the photoresist pattern flows so that an angle between a side surface of the photoresist pattern and an upper surface of a substrate, on which the photoresist pattern is formed, becomes no more than about 40 degrees.

FIGS. 1A to 1D are scanning electronic microscope ("SEM") pictures showing a photoresist pattern formed from a conventional photoresist composition flowing when baked.

Particularly, FIG. 1A is an SEM picture showing a process developing a photoresist pattern, and FIG. 1B is an SEM picture showing an initial profile of the photoresist pattern after being developed. An angle between a side surface of the photoresist pattern and an upper surface of a substrate, on which the photoresist pattern is formed, is about 50 degrees.

After the developing process, the photoresist pattern is post-baked and hard-baked in order to increase an etching-resistance of the photoresist pattern. When the photoresist pattern is heated it flows so that an angle between the side surface of the photoresist pattern and the upper surface of the substrate, on which the photoresist pattern is formed, decreases. The resulting angles become about 30 degrees to about 35 degrees.

FIG. 1C is an SEM picture showing the photoresist pattern after a hard-baking process, and FIG. 1D is an SEM picture showing a profile of the photoresist pattern which has reflown through a hard-baking process.

When the photoresist pattern reflows, a channel length between rises in the photoresist becomes narrower as shown in FIG. 1C. Thus, a time for etching is increased, and a skew is increased.

Furthermore, the photoresist pattern formed from a conventional photoresist composition is sensitive to a temperature variation of the equipment used in its manufacture so that a shape of the photoresist pattern depends on a temperature variation of the manufacturing apparatuses. Thus, a thickness variation of the photoresist pattern is increased so that a short circuit may be caused in an area where the photoresist pattern is relatively thick, and an open defect may be caused in an area where the photoresist pattern is relatively thin.

BRIEF SUMMARY OF THE INVENTION

The present invention provides a photoresist composition having a relatively high heat-resistance so that reflowing during a baking process is minimized.

The present invention also provides a method of manufacturing a thin-film transistor substrate using the above-mentioned photoresist composition so that the etch skew and the uniformity of the pattern are improved to reduce defects due to electrical shorts and openings.

In one aspect of the present invention, an exemplary embodiment of a photoresist composition includes about 100 parts by weight of a resin mixture including a novolak resin and an acryl resin and about 10 parts to about 50 parts by weight of a naphthoquinone diazosulfonic acid ester.

The weight-average molecular weight of the novolak resin may be no less than about 30,000.

The acryl resin may be a copolymer which is obtained by polymerizing at least two selected from the group consisting of methyl methacrylate, ethyl methacrylate, methacrylic acid, styrene, benzyl acrylate and acrylic acid.

The weight-average molecular weight of the acryl resin may be no less than about 20,000.

The acryl resin may make up about 1% to about 15% of the total weight of the resin mixture.

The photo resist composition may also include an organic solvent.

The organic solvent may include at least one selected from the group consisting of propylene glycol monomethyl ether acetate and benzyl alcohol.

In another aspect of the present invention, there is provided an exemplary embodiment of a method of manufacturing a thin-film transistor substrate. In the exemplary embodiment of a method, a gate line is formed on a base substrate. A gate insulating layer, a semiconductor layer and a data layer are sequentially formed on the gate line and the base substrate. A photoresist composition is coated on the data layer to form a photoresist film. The photoresist composition includes about 100 parts by weight of a resin mixture including novolak resin and acryl resin and about 10 parts to about 50 parts by weight of a naphthoquinone diazosulfonic acid ester. The photoresist film is patterned to form a photoresist pattern. The data layer is firstly etched by using the photoresist pattern as a mask. The semiconductor layer is etched by using an etched data layer. The photoresist pattern is heated to form a heated photoresist pattern. The data layer is secondly etched by using a heated photoresist pattern as a mask.

The weight-average molecular weight of the novolak resin may be no less than about 30,000.

The weight-average molecular weight of the acryl resin may be no less than about 20,000.

The acryl resin may make up about 1% to about 15% of the total weight of the resin mixture.

According to the above, a photoresist composition has a relatively high heat-resistance. Thus, when a photoresist film formed using the photoresist composition is heated, a profile variation of the photoresist film is relatively small. Furthermore, a short circuit and/or an open defect in a TFT substrate may be reduced.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1A:
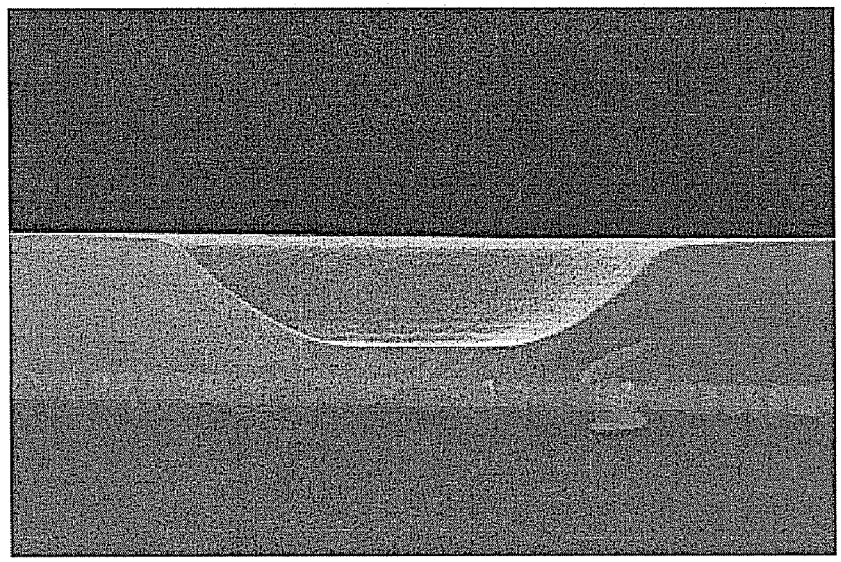
FIGS. 1A to 1D are SEM pictures showing a photoresist pattern formed from a conventional photoresist composition flowing when baked.
Figure 1B:
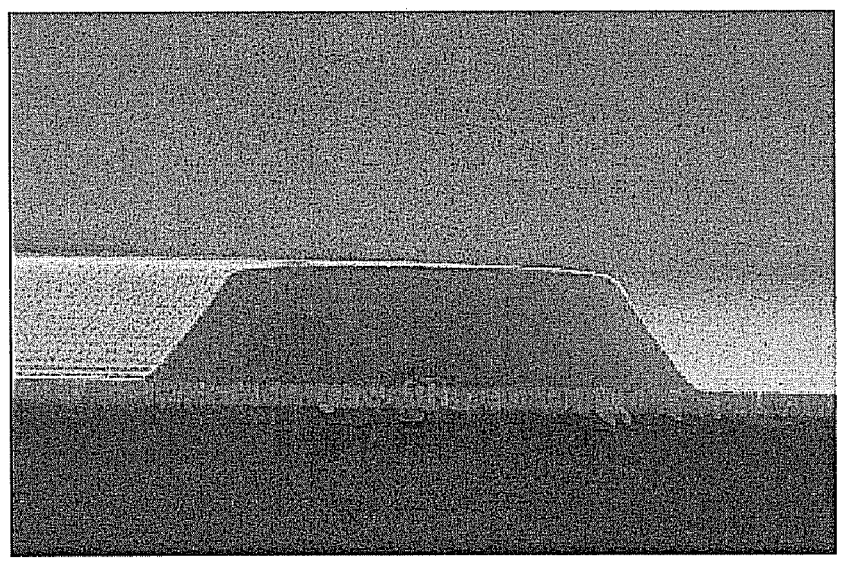
Figure 1C:
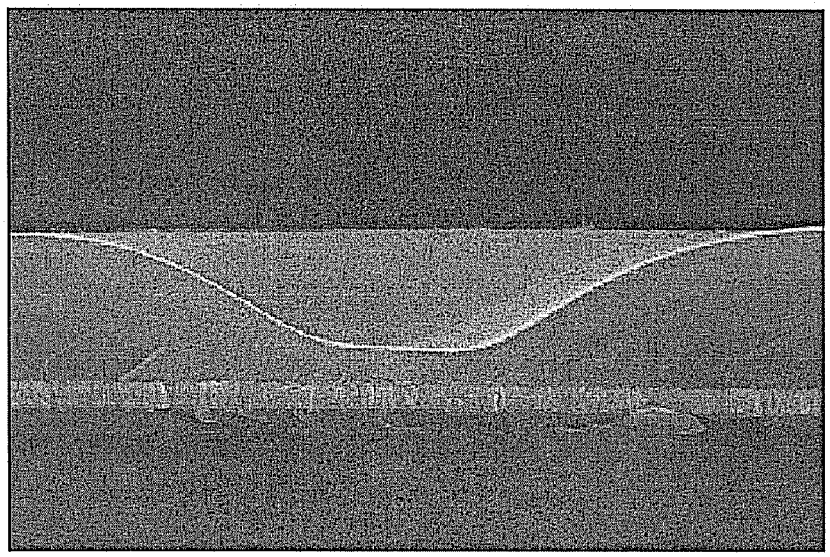
Figure 1D:

The present invention is described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of present the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the present invention should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

An exemplary embodiment of a photoresist composition according to the present invention is a positive photoresist composition and has a relatively high heat-resistance. The photoresist composition includes about 100 parts by weight of a resin mixture and about 10 parts to about 50 parts by weight of naphthoquinone diazosulfonic acid ester.

The resin mixture includes a novolak resin and an acryl resin.

The novolak resin may be synthesized by reacting a phenol-based compound and an aldehyde-based compound. Exemplary embodiments of the phenol-based compound include phenol, para-cresol, meta-cresol, or other substances with similar characteristics. These can be used alone or in a mixture thereof. Exemplary embodiments of the aldehyde-based compound include formaldehyde, benzaldehyde, acetaldehyde, or other substances with similar characteristics. An acid catalyst is used for reacting the phenol-based compound and the aldehyde-based compound. In one exemplary embodiment, the acid catalyst is oxalic acid. The novolak resin may include a plurality of novolak resins differing from one another to improve a residual ratio and a sensitivity of the photoresist composition.

The weight-average molecular weight of the novolak resin may be no less than about 30,000 grams/mol. From this point forward all weight-average molecular weights will be in grams/mol unless otherwise specified.

The acryl resin is a copolymer synthesized from monomers. Exemplary embodiments of the monomers include methyl methacrylate, ethyl methacrylate, methacrylic acid, styrene, benzylacrylate, acrylic acid, or other substances with similar characteristics. For example, the acryl resin may be synthesized from at least two kinds of the above-mentioned monomers.

The weight-average molecular weight of the acryl resin may be no less than about 20,000.

The acryl resin may comprise about 1% to about 15% of the total resin mixture by weight. One exemplary embodiment has the acryl resin comprising about 5% to about 12% of the total weight of the resin mixture.

Exemplary embodiments of the naphthoquinone diazosulfonic acid ester may include 2,3,4-trihydroxy benzophenone ester of naphthoquinone 1,2-diazo-5-sulfonic acid, 2,3,4,4'-tetrahydroxy benzophenone ester of naphthoquinone 1,2-diazo-5-sulfonic acid, or other substances with similar characteristics.

The naphthoquinone diazosulfonic acid ester may comprise about 10 parts to about 50 parts by weight with respect to about 100 parts by weight of the resin mixture, e.g. the naphthoquinone diazosulfonic acid ester may comprise as much as about a third, or as little as about one eleventh of the total weight of the photoresist composition. When the naphthoquinone diazosulfonic acid ester content of the photoresist composition is less than about 10 parts by weight, a thickness of a portion of a photoresist which is not exposed to light, and therefore leftover after the developing process, may be excessively thin. When the content of the naphthoquinone diazosulfonic acid ester is more than about 50 parts by weight, a sensitivity of the photoresist composition may be reduced, and residue of the photoresist may remain after being developed. In one exemplary embodiment, the content of the naphthoquinone diazosulfonic acid ester may be about 20 parts to about 40 parts by weight with respect to about 100 parts by weight of the resin mixture.

The photoresist composition may be mixed with an organic solvent. Exemplary embodiments of the organic solvent may include ketone, propylene glycol monomethyl ether acetate, benzyl alcohol, gamma-butyrolactone, ethyl lactate, n-buthyl acetate, methoxy methyl propionate, an alcohol and a derivative thereof, and other substances with similar characteristics. Exemplary embodiments of the ketone include 2-hepanone, chlorohexanone, etc. Exemplary Embodiments of the alcohol and the derivative thereof include ethylene glycol, ethylene glycol monoalkyl ether, monopropyl ether, monobutyl ether, diethylene glycol, monopropyl ether of monoacetic acid, and other substances with similar characteristics. These can be used alone or in a mixture thereof.

The photoresist composition may further include an additive such as a surfactant, or other similar substances.

The photoresist composition is described more fully hereinafter with reference to the accompanying examples. This invention may, however, be embodied in many different forms and should not be construed as limited to the examples set forth herein.

Example 1

A mixture including formaldehyde, metha-cresol and para-cresol were polymerized in the presence of an oxalic acid catalyst to prepare a novolak resin. A ratio of the metha-cresol to para-cresol in the novolak resin was about 60 to about 40 by weight. A weight-average molecular weight of the novolak resin was about 38,000.

The novolak resin was mixed with an acryl resin, of which a weight-average molecular weight was about 28,000, such that the acryl resin content was about 10% by weight based on the total weight of the resin mixture.

The resin mixture was mixed with about 20 parts by weight of 2,3,4,4'-tetrahydroxy benzophenone ester of naphthoquinone 1,2-diazo-5-sulfonic acid with respect to about 100 parts by weight of the resin mixture to prepare a final mixture. The final mixture was solved in about 200 parts by weight of a solvent to prepare a solution. The solvent included propylene glycol monomethyl ether acetate and benzyl alcohol. The solution was filtered by a filter, of which a diameter was about 0.2 μm to prepare a photoresist composition.

Comparative Example 1

A mixture including formaldehyde metha-cresol and para-cresol were polymerized in the presence of an oxalic acid catalyst to prepare a novolak resin. A ratio of the metha-cresol to para-cresol in the novolak resin was about 60 parts by weight to about 40 parts by weight. A weight-average molecular weight of the novolak resin was about 12,000. 100 parts by weight of the novolak resin were mixed with about 20 parts by weight of 2,3,4,4'-tetrahydroxy benzophenone ester of naphthoquinone 1,2-diazo-5-sulfonic acid to obtain a final mixture. The final mixture was solved in about 200 parts by weight of a solvent to prepare a solution. The solvent included propylene glycol monomethyl ether acetate and benzyl alcohol. The solution was filtered by a filter, of which a diameter was about 0.2 µM to prepare a photoresist composition.

Comparative Example 2

A mixture including formaldehyde metha-cresol and para-cresol were polymerized in the presence of an oxalic acid catalyst to prepare a novolak resin. A ratio of the metha-cresol to para-cresol in the novolak resin was about 60 parts by weight to about 40 parts by weight. A weight-average molecular weight of the novolak resin was about 27,000. 100 parts by weight of the novolak resin were mixed with about 20 parts by weight of 2,3,4,4'-tetrahydroxy benzophenone ester of naphthoquinone 1,2-diazo-5-sulfonic acid to obtain a final mixture. The final mixture was solved in about 200 parts by weight of a solvent mixture to prepare a solution. The solvent included propylene glycol monomethyl ether acetate and benzyl alcohol. The solution was filtered by a filter, of which a diameter was about 0.2 µm to prepare a photoresist composition.

Experiment for Evaluation of Photoresist Pattern

A plurality of photoresist patterns was formed by using the photoresist compositions of Example 1 and Comparative Examples 1 and 2. A thickness deviation (A), a profile and a skew of each of the photoresist patterns were measured. Particularly, an inclination (B) of the photoresist pattern before being heated, an inclination (C) of the photoresist pattern heated to a temperature of about 130° C. and an inclination (D) of the photoresist pattern heated to a temperature of about 135° C. were measured. Furthermore, a skew (E) after a first etching and a skew (F) after first etching, active-etching and an etching back were measured. Obtained results are illustrated in the following Table 1.

TABLE 1

|  | | Profile (°) | | | Skew (µm) | |
| --- | --- | --- | --- | --- | --- | --- |
|  | A (Å) | B | C | D | E | F |
| Example 1 | 2000 | 46.6 | 46.1 | 45.2 | 2.0 | 2.52 |
| Comparative Example 1 | 6000 | 41 | 31 | 29 | 2.7 | 3.5 |
| Comparative Example 2 | 2500 | 43 | 37 | 35 | 2.2 | 3.4 |

Referring to Table 1, an inclination variation of the photoresist pattern formed using the photoresist composition of Example 1 before and after being heated was relatively small. Thus, the skew was reduced in comparison with Comparative Examples 1 and 2

Figure 2A:
FIGS. 2A, 2B and 2C are SEM pictures illustrating the exemplary embodiment of a photoresist pattern formed using the photoresist composition of Example 1.
Figure 2B:
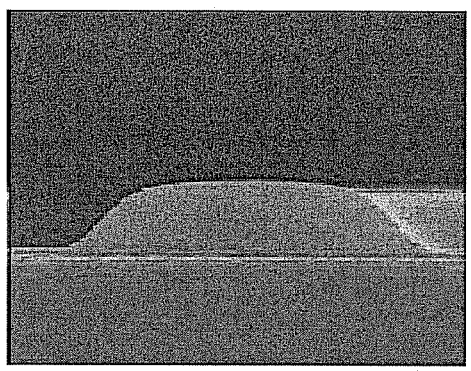
Figure 2C:
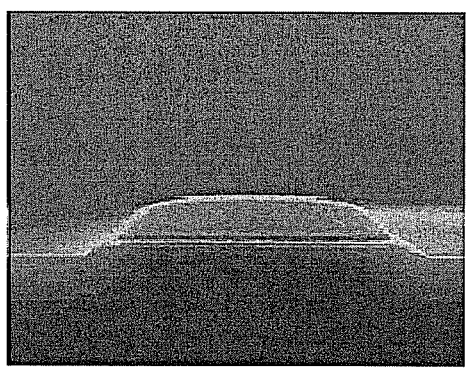
Figure 3A:
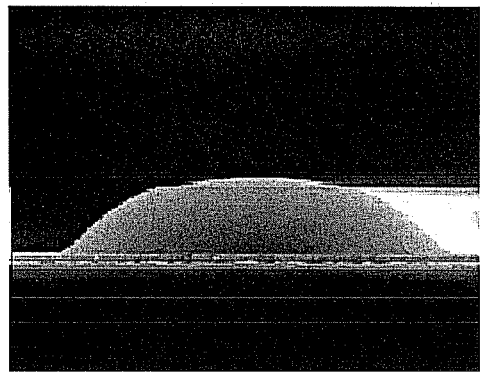
FIGS. 3A, 3B and 3C are SEM pictures illustrating the photoresist pattern formed using the photoresist composition of Comparative Example 1.
Figure 3B:
Figure 3C:
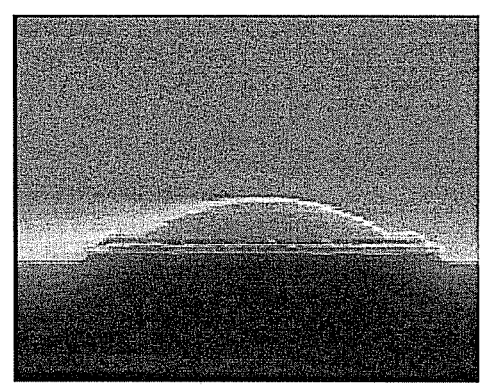
Figure 4A:
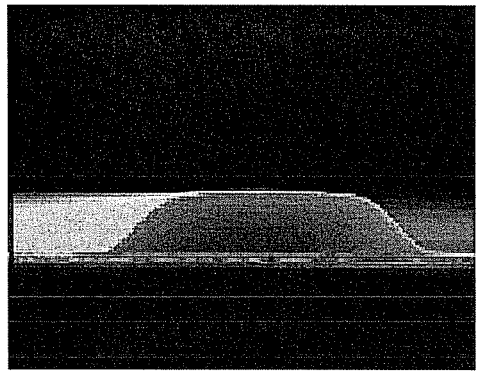
FIGS. 4A, 4B and 4C are SEM pictures illustrating the photoresist pattern formed using the photoresist composition of Comparative Example 2.
Figure 4B:
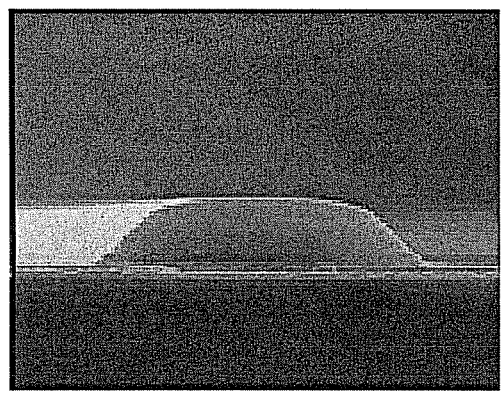
Figure 4C:
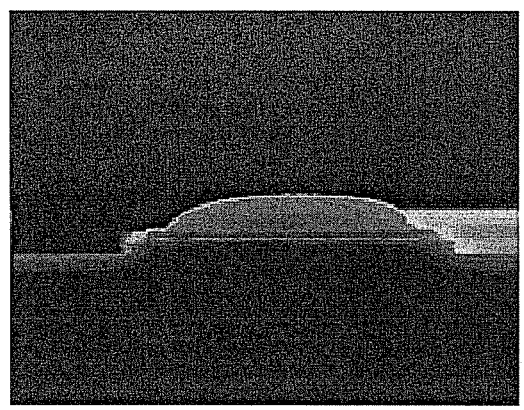

FIGS. 2A, 2B and 2C are SEM pictures illustrating the photoresist pattern formed using the photoresist composition of Example 1. Particularly, FIG. 2A is an SEM picture illustrating the photoresist pattern before being hard-baked, and FIG. 2B is an SEM picture illustrating the photoresist pattern after being hard-baked, and FIG. 2C is an SEM picture illustrating the photoresist pattern after being dry-etched. FIGS. 3A, 3B and 3C are SEM pictures illustrating the photoresist pattern formed using the photoresist composition of Comparative Example 1 undergoing the same processes. FIGS. 4A, 4B and 4C are SEM pictures illustrating the photoresist pattern formed using the photoresist composition of Comparative Example 2 undergoing the same processes.

Referring to FIGS. 2A to 4C, it can be noted that the photoresist pattern formed using the photoresist composition of Example 1 has a relatively large heat-resistance so that a shape variation of the photoresist pattern is relatively small when heated.

A method of manufacturing a thin-film transistor ("TFT") substrate according to an exemplary embodiment of the present invention is described more fully hereinafter with reference to the accompanying drawings.

Method of Manufacturing a Thin-Film Transistor Substrate

An exemplary embodiment of a TFT substrate and an exemplary embodiment of a method of manufacturing the TFT substrate are described with reference to FIGS. 5, 6 and 7.

Figure 5:
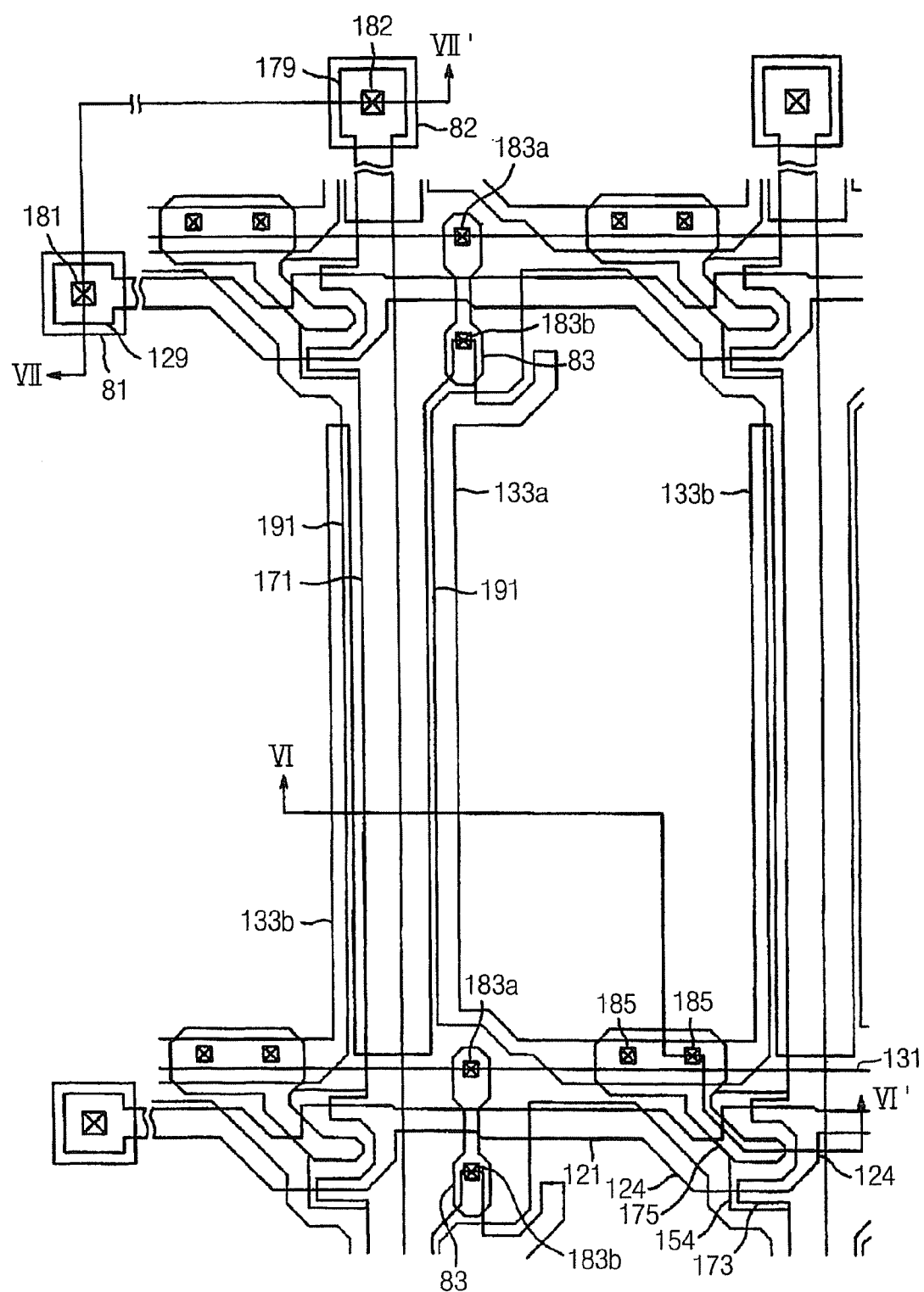
FIG. 5 is a top plan view illustrating an exemplary embodiment of a TFT substrate according to the present invention.

FIG. 5 is a top plan view illustrating an exemplary embodiment of a TFT substrate according to the present invention. FIG. 6 is a cross-sectional view taken along line VI-VI' of FIG. 5. FIG. 7 is a cross-sectional view taken along line VII-VII' of FIG. 5.

Figure 6:
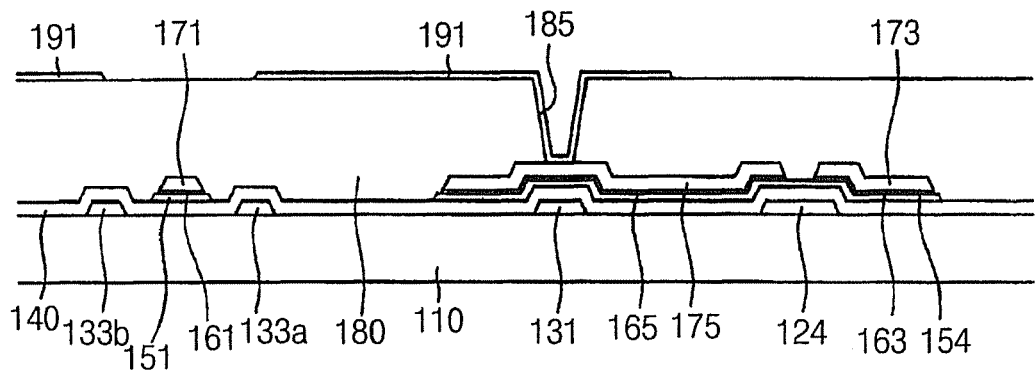
FIG. 6 is a cross-sectional view taken along line VI-VI' of FIG. 5.
Figure 7:
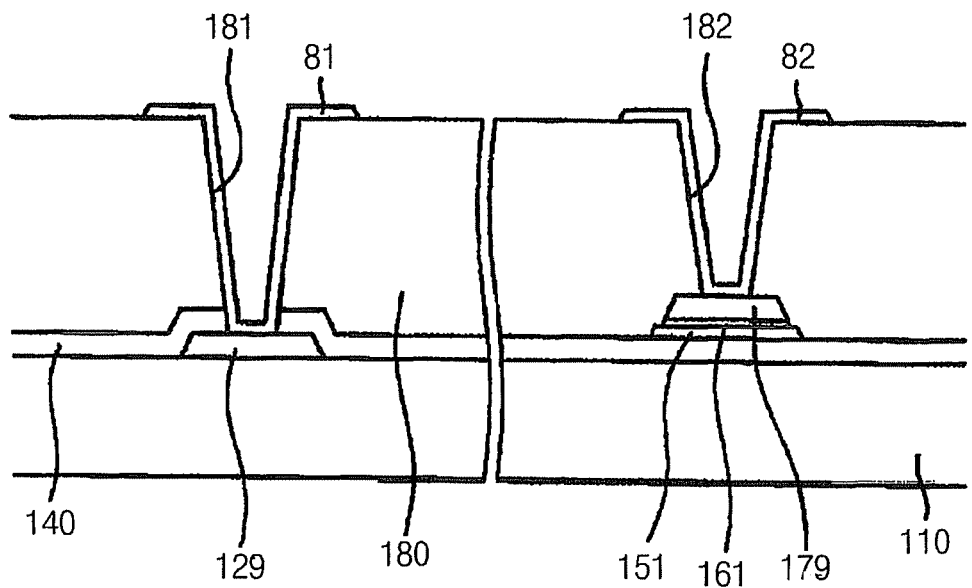
FIG. 7 is a cross-sectional view taken along line VII-VII' of FIG. 5.

Referring to FIGS. 5 to 7, a plurality of gate lines 121 and a plurality of storage electrode lines 131 are formed on a base substrate 110. Exemplary embodiments of the base substrate 110 include glass, polymer, and other substances with similar characteristics.

The gate line 121 delivers a gate signal and extends in a row direction. Each of the gate lines 121 includes a plurality of gate electrodes 124 and an end 129 electrically connected to an external driving circuit or a layer formed on or under the gate line 121. A gate driving circuit (not shown) generating the gate signal may be formed on a flexible printed circuit film (not shown) coupled to the base substrate 110. Alternative embodiments include configurations where the gate driving circuit may be directly formed on the base substrate 110 or may be integrally formed with the base substrate 110. When the gate driving circuit is integrally formed with the base substrate 110, the gate driving circuit may be directly connected to the gate line 121.

A predetermined voltage is applied to the storage electrode line 131. The storage electrode line 131 includes a branch substantially parallel with the gate line 121, a first storage electrode 133a and a second storage electrode 133b extended from the branch. Each of the storage electrode lines 131 is disposed between two adjacent gate lines 121. Each of the storage electrodes 133a and 133b include a secured end connected to the branch and a free end opposite to the secured end. A free end of the first storage electrode 133a has a size larger than a free end of the second storage electrode 133b and has a branching end with a first branch straightly extended therefrom and a second branch extending therefrom in a slightly bended manner. However, alternative configurations of the storage electrode line 131 may have various shapes.

Exemplary embodiments of each of the gate lines 121 and the storage electrode lines 131 may include aluminum (Al), silver (Ag), copper (Cu), chrome (Cr), tantalum (Ta), titanium (Ti), molybdenum (Mo), an alloy thereof, or other similar substances. Alternative configurations include an exemplary embodiment in which each of the gate lines 121 and the storage electrode lines 131 include a multiple layer structure which includes a first layer and a second layer having physical characteristics which differ from the first layer. One exemplary embodiment of this alternative configuration includes a first layer which may include aluminum, silver, copper, an alloy thereof, or similar substances in order to reduce a signal delay and/or a voltage drop and a second layer which may include a metal such as chrome, tantalum, titanium, molybdenum, an alloy thereof, or other similar substances, which is advantageously in contact characteristics with a transparent conductive material, such as indium tin oxide ("ITO"), indium zinc oxide ("IZO"), etc. Particularly, each of the gate lines 121 and the storage electrode lines 131 may include a multiple layer such as chrome/aluminum layer, aluminum/molybdenum layer, etc as suggested above. Each of the gate lines 121 and the storage electrode lines 131 may include a various conductive material besides the above.

A side surface of each of the gate lines 121 and the storage electrode lines 131 is inclined with respect to an upper surface of the base substrate 110. In one exemplary embodiment the angle of the inclination is about 30 degrees to about 80 degrees.

A gate insulating layer 140 is formed on the substrate 110, gate lines 121 and the storage electrode lines 131. Exemplary embodiments of the gate insulating layer 140 include silicon nitride ("SiNx"), silicon oxide ("SiOx"), or other similar substances.

A plurality of semiconductor layers 151 is formed on the gate insulating layer 140. In one exemplary embodiment the semiconductor layer 151 includes hydrogenated amorphous silicon. The semiconductor layer 151 extends in a column direction and has a protrusion layer 154 covering the gate electrode 124. The semiconductor layer 151 covers the gate line 121 and the storage electrode line 131.

A first ohmic contact layer 161 having a liner shape and a second ohmic contact layer 165 having an island shape are formed on each of the semiconductor layers 151. Exemplary embodiments of the first and second ohmic contact layers 161 and 165 may include silicide, $n^+$ hydrogenated amorphous silicon into which $n^+$ impurities such as phosphorous (P) are implanted, or other similar substances. The first ohmic contact layer 161 has a protrusion layer 163. Both the protrusion layer 163 of the first ohmic contact layer 161 and the second ohmic contact layer 165 are disposed on the protrusion layer 154 of the semiconductor layer 151.

A side surface of each of the semiconductor layers 151 and the first and second ohmic contact layers 161 and 165 is inclined with respect to the upper surface of the base substrate 110. In one exemplary embodiment the angle of the inclination is about 30 degrees to about 80 degrees.

A plurality of data lines 171 and a plurality of drain electrodes 175 are formed on the first and the second ohmic contact layers 161 and 165.

The data line 171 delivers a data signal and extends in the column direction to cross the gate line 121. Each of the data lines 171 crosses the storage electrode line 131 and is disposed between the first and the second storage electrodes 133a and 133b. Each of the data lines 171 includes a source electrode 173 and an end 179 electrically connected to an external driving circuit or a layer formed on or under the data line 171. A data driving circuit (not shown) generating the data signal may be formed on a flexible printed circuit film (not shown) coupled to the base substrate 110. Alternative embodiments include configurations where the data driving circuit may be directly formed on the base substrate 110 or may be integrally formed with the base substrate 110. When the data driving circuit is integrally formed with the base substrate 110, the data driving circuit may be directly connected to the data line 171.

The drain electrode 175 is spaced apart from the data line 171 and faces the source electrode 173. Each of the drain electrodes 175 has a first end having a bar-shape and a second end having a size larger than the first end. The first end is surrounded by the source electrode 173, and the second end overlaps with the storage electrode line 131. Alternative configurations with various shapes are within the scope of the present invention.

A TFT includes the gate electrode 124, the source electrode 173, the drain electrode 175 and the protrusion layer 154 of the semiconductor layer 151. A channel layer is formed at the protrusion layer 154 of the semiconductor layer 151 between the source electrode 173 and the drain electrode 175.

Exemplary embodiments of the data lines 171 and the drain electrodes 175 may include a refractory metal or an alloy thereof, or other similar substance. Alternative embodiments include configurations where each of the data lines 171 and the drain electrodes 175 may include a multiple layer having a refractory metal layer and a low-resistance metal layer. Particularly, the multiple layer may include a lower layer including chrome and/or molybdenum and an upper layer including aluminum. Further alternative configurations include a multiple layer structure which may include a lower layer including molybdenum, a middle layer including aluminum and an upper layer including molybdenum. Each of the data lines 171 and the drain electrodes 175 may include a various conductive material besides the above.

A side surface of each of the data lines 171 and the drain electrodes 175 is inclined with respect to the upper surface of the base substrate 110. In one exemplary embodiment the angle of the inclination is about 30 degrees to about 80 degrees.

The first ohmic contact layer 161 is disposed between the semiconductor layer 151 and the data line 171 to reduce a contact resistance therebetween, and the second ohmic contact layer 165 is disposed between the semiconductor layer 151 and the drain electrode 175 to reduce a contact resistance therebetween.

The semiconductor layer 151, except for the protrusion layer 154, has a shape which is substantially the same as the data line 171, the drain electrode 175 and the first and the second ohmic contact layers 161 and 165 when viewed from a top plan view. Particularly, the semiconductor layer 151 is overlapped with the data line 171, the drain electrode 175 and the first and the second ohmic contact layers 161 and 165. A portion of the semiconductor layer 151 between the source electrode 173 and the drain electrode 175 is exposed. The semiconductor layer 151 may have a size larger than the data line 171 and the drain electrode 175 as necessary in view of manufacturing requirements.

A passivation layer 180 is disposed on the data line 171, the drain electrode 175 and the exposed portion of the semiconductor layer 151.

Exemplary embodiments of materials which may be used for the passivation layer 180 include an organic insulating material, a low-dielectric insulating material, a ceramic insulating material such as silicon nitride, silicon oxide, or other similar substances. According to one exemplary embodiment a dielectric constant of each of the organic insulating material and the low-dielectric insulating material may be no less than about 4.0. According to one exemplary embodiment the low-dielectric insulating material may include amorphous silicon formed through a plasma enhanced chemical vapor deposition ("PECVD") method. The organic insulating material may have photosensitive characteristics. A surface of the passivation layer 180 may be substantially flat. Alternative exemplary embodiments include configurations where the passivation layer 180 includes a lower ceramic layer and an upper organic layer in order to have good insulating characteristics without damaging the exposed portion of the underlying semiconductor layer 151.

A plurality of contact holes 182 and 185 are formed in the passivation layer 180 to expose an end 179 of the data line 171 and the drain electrode 175, respectively. Furthermore, a plurality of contact holes 181 are formed through the passivation layer 180 and the gate insulating layer 140 to expose an end 129 of the gate line 121, and a plurality of contact holes 183a and 183b are formed through the passivation layer 180 and the gate insulating layer 140 to expose a portion of the storage electrodes 133a and 133b and a portion of the storage electrode line 131.

A plurality of pixel electrodes 191, a plurality of overpasses 83 and a plurality of contact assistants 81 and 82 are formed on the passivation layer 180. Each of the pixel electrodes 191, the overpasses 83 and the contact assistants 81 and 82 may include a transparent conductive material, such as ITO, IZO, or other similar substance, and/or a reflective metal such as aluminum, silver, an alloy thereof, or other similar substance.

The pixel electrode 191 is electrically connected to the drain electrode 175 through the contact hole 185, and a data voltage is applied to the pixel electrode through the drain electrode 175. The pixel electrode 191, to which the data voltage is applied, forms an electric field with a common electrode (not shown), to which a common voltage is applied. The pixel electrode 191 in combination with the common electrode control alignments of liquid crystal molecules in a liquid crystal layer (not shown) between the pixel electrode 191 and the common electrode. Particularly, the pixel electrode 191 and the common electrode form a liquid crystal capacitor to maintain a voltage level of the electric field after the TFT is turned off.

The pixel electrode 191 overlaps with the storage electrodes 133a and 133b and the storage electrode line 131. The pixel electrode 191, the drain electrode 171 and the storage electrode line 131 form a storage capacitor to maintain the voltage level of the electric field. The storage capacitor is separate from the liquid crystal capacitor, but serves a similar purpose.

The contact assistants 81 and 82 are respectively connected to the end 129 of the gate line 121 and the end 179 of the data line 171 through the contact holes 181 and 182. The contact assistants 81 and 82 reinforce adhesion between an external apparatus (not shown) and each of the end 129 of the gate line 121 and end 179 of the data line 171 and protects the end 129 of the gate line 121 and end 179 of the data line 171.

The overpass 83 crosses the gate line 121 and is electrically connected to the storage electrode line 131 and the second storage electrode 133b through the contact holes 183a and 183b.

Figure 8:
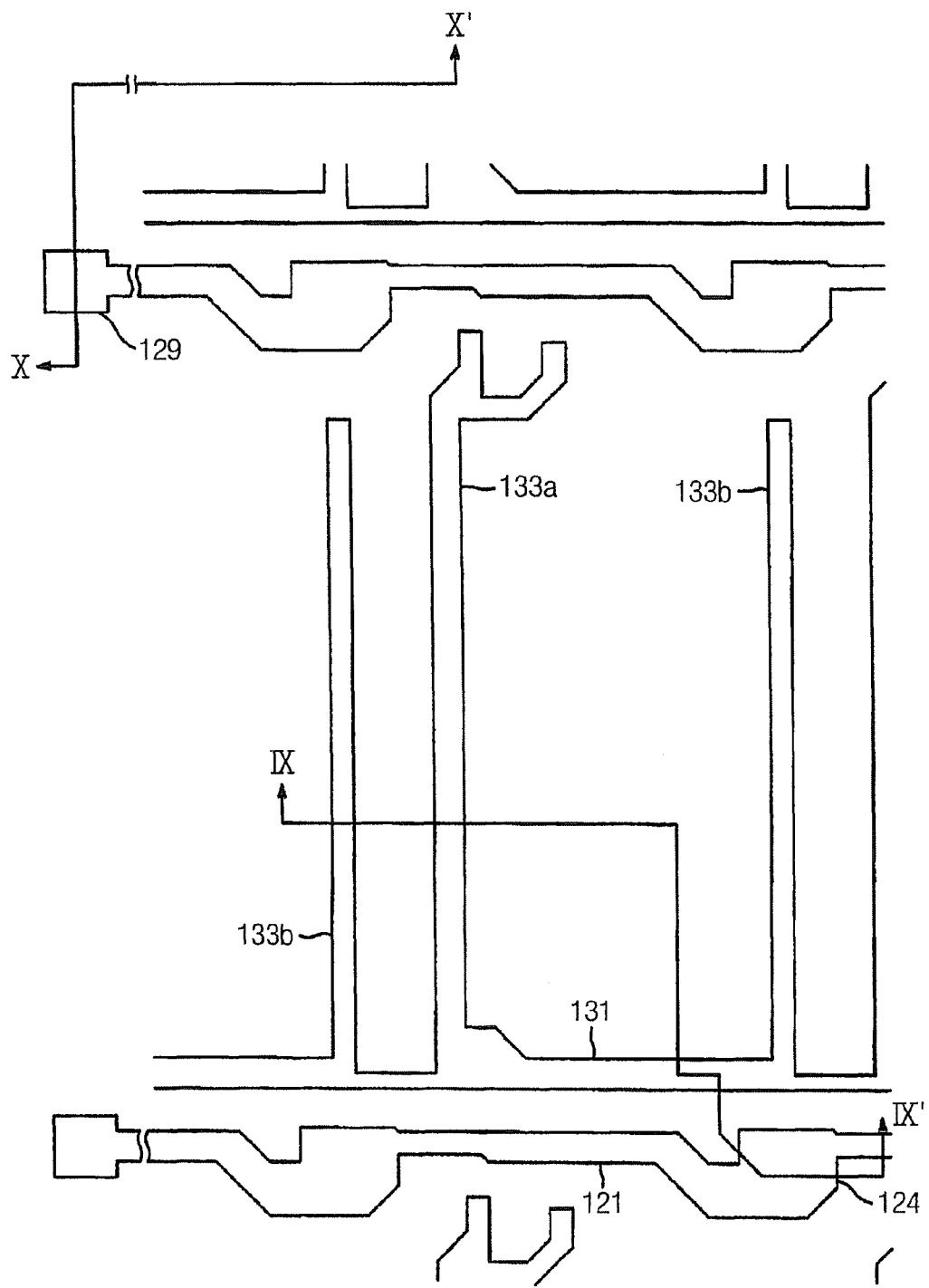
FIG. 8 is a top plan view illustrating an exemplary embodiment of a method of manufacturing a TFT substrate according to the present invention.
Figure 9:
FIG. 9 is a cross-sectional view taken along line IX-IX' of FIG. 8.
Figure 10:
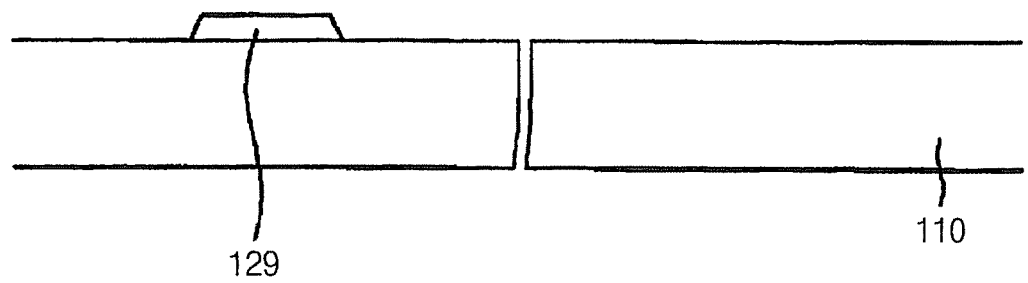
FIG. 10 is cross-sectional view taken along line X-X' of FIG. 8.
Figure 18:
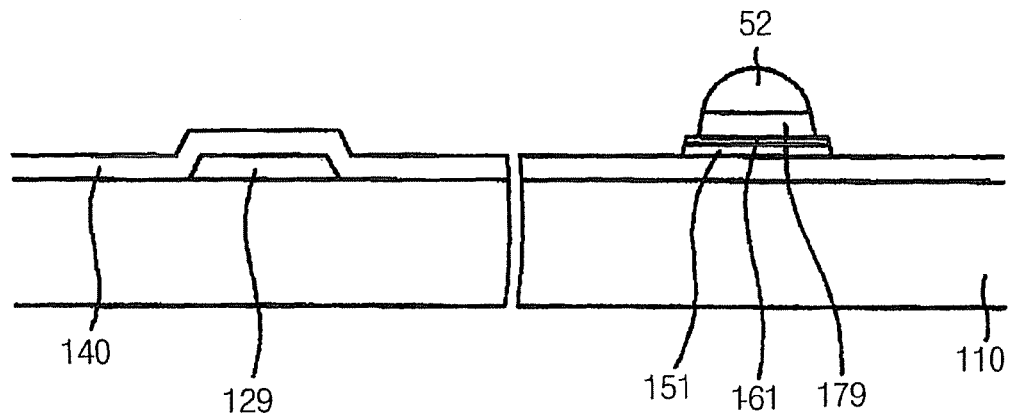
Figure 19:
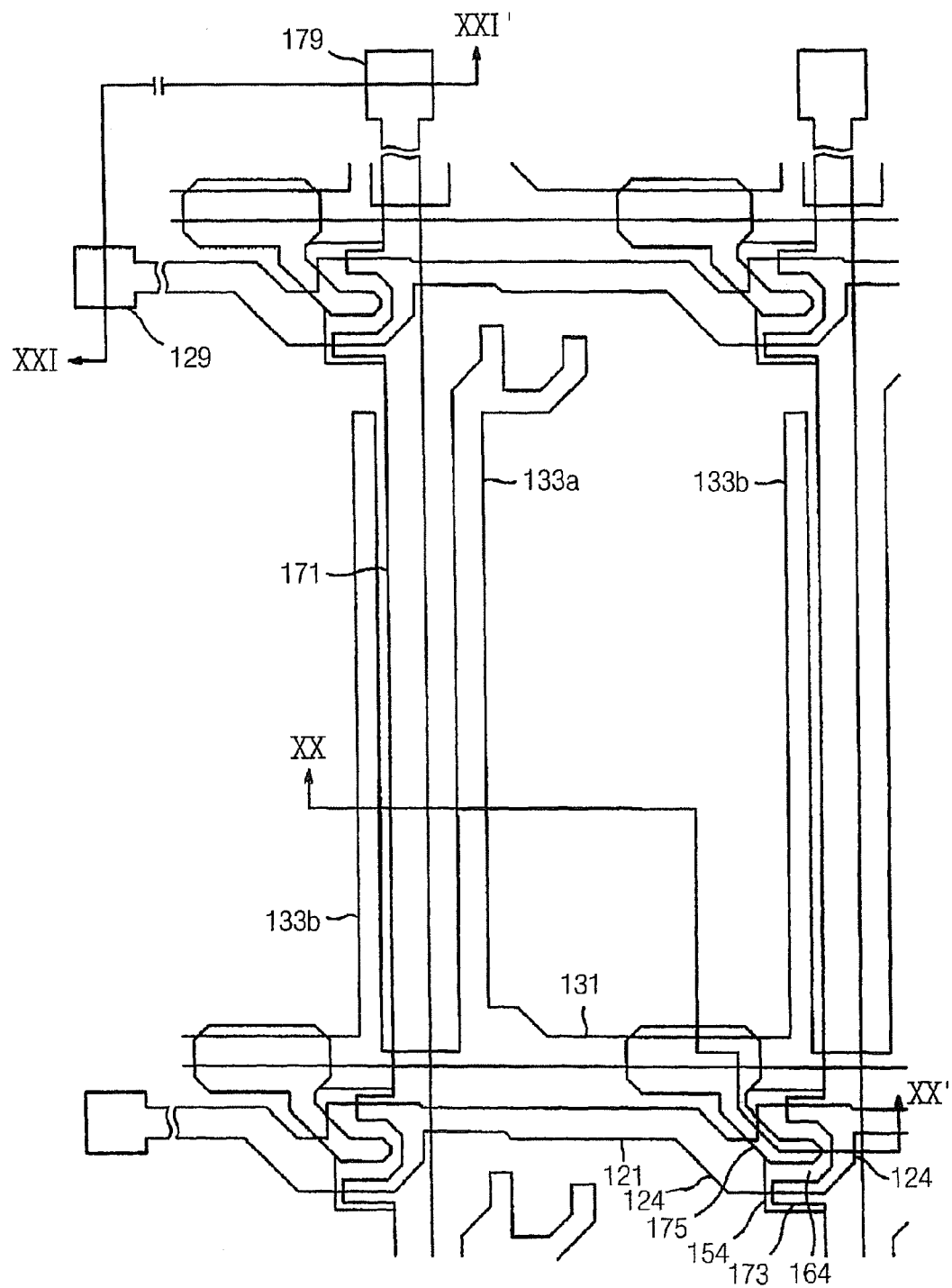
FIG. 19 is a top plan view illustrating an exemplary embodiment of a method of manufacturing a TFT substrate according to the present invention.
Figure 20:
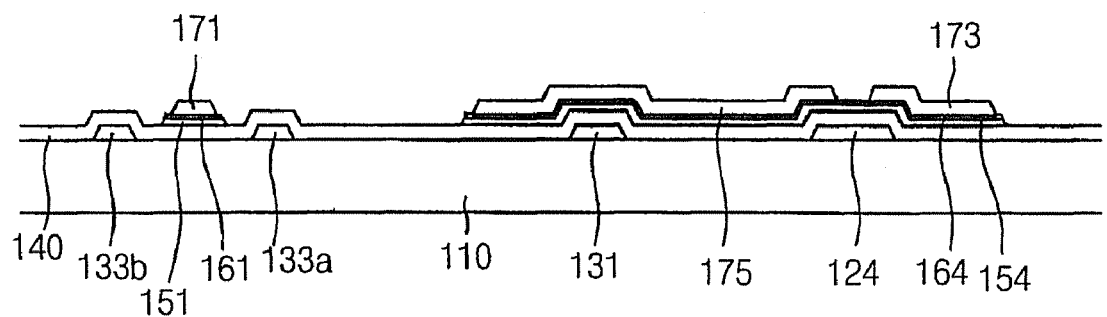
FIG. 20 is a cross-sectional view taken along line XX-XX' of FIG. 19.
Figure 21:
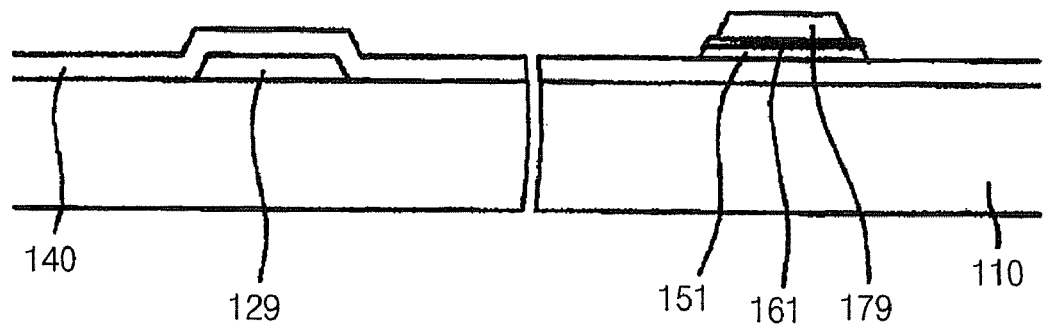
FIG. 21 is a cross-sectional view taken along line XXI-XXI' of FIG. 19.
Figure 22:
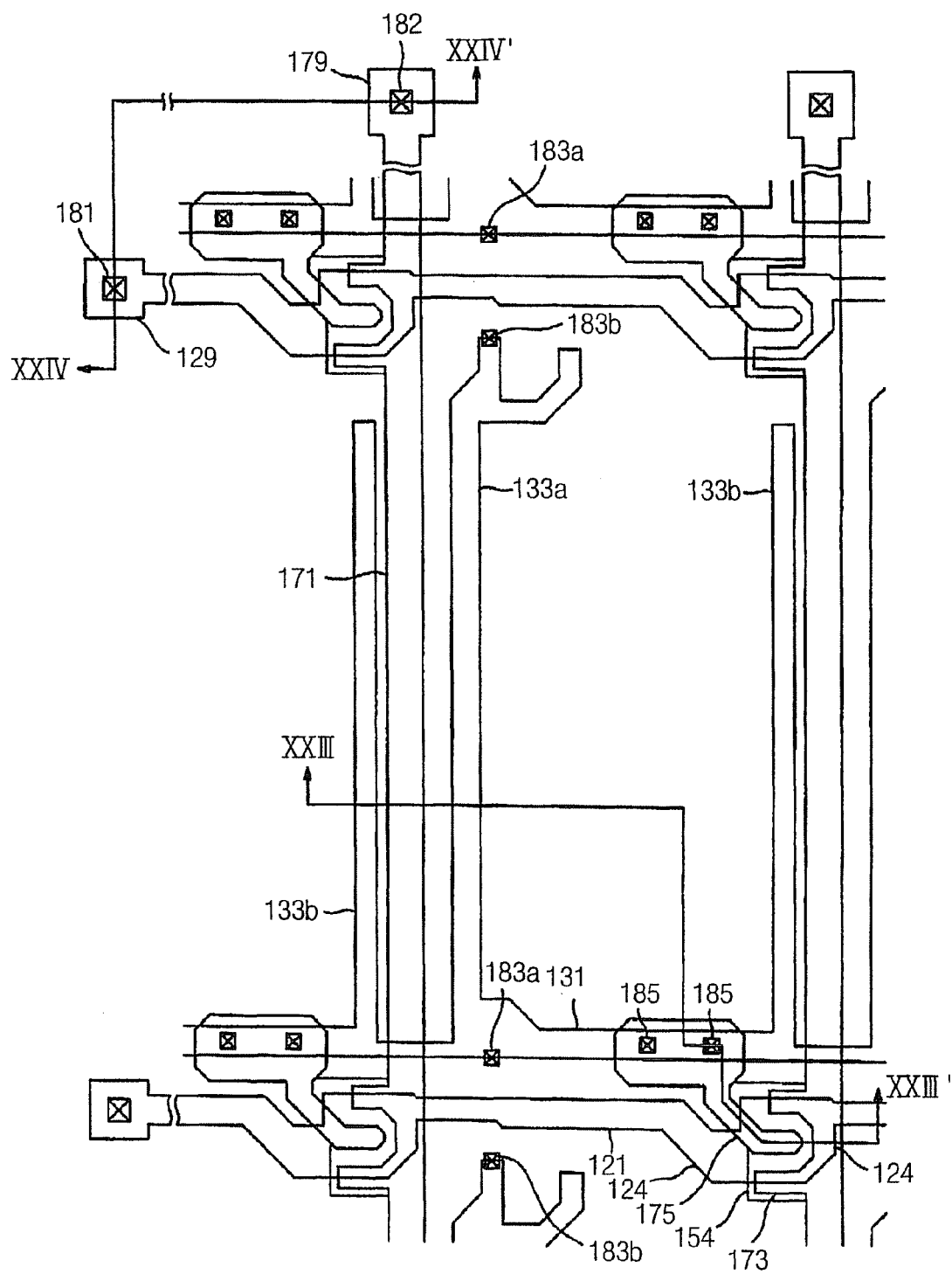
FIG. 22 is a top plan view illustrating an exemplary embodiment of a method of manufacturing a TFT substrate according to the present invention.
Figure 23:
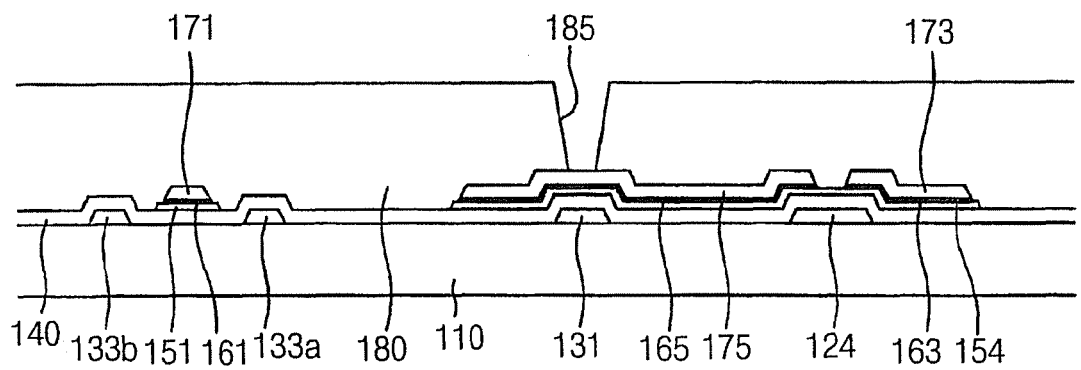
FIG. 23 is a cross-sectional view taken along line XXIII-XXIII' of FIG. 22.
Figure 24:
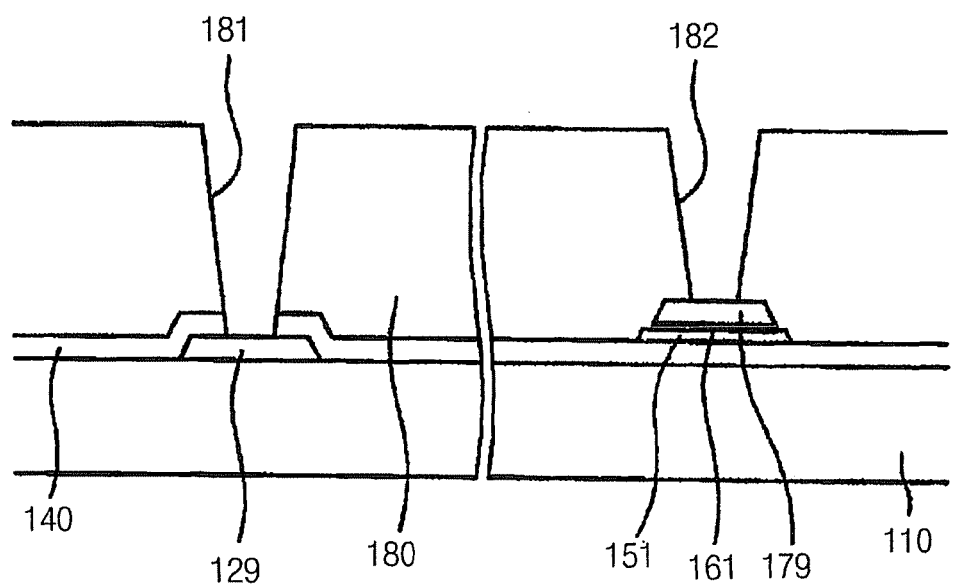
FIG. 24 is a cross-sectional view taken along line XXIV-XXIV' of FIG. 22.

FIGS. 8, 19 and 22 are top plan views illustrating an exemplary embodiment of a method of manufacturing a TFT substrate according to the present invention. FIG. 9 is a cross-sectional view taken along line IX-IX' of FIG. 8, and FIG. 10 is cross-sectional view taken along line X-X' of FIG. 8. FIGS. 11, 12, 13, 14, 15, 16, 17 and 18 are cross-sectional views illustrating an exemplary embodiment of a method of manufacturing a TFT substrate according to the present invention. FIG. 20 is a cross-sectional view taken along line XX-XX' of FIG. 19. FIG. 21 is a cross-sectional view taken along line XXI-XXI' of FIG. 19. FIG. 23 is a cross-sectional view taken along line XXIII-XXIII' of FIG. 22. FIG. 24 is a cross-sectional view taken along line XXIV-XXIV' of FIG. 22.

Referring to FIGS. 8 to 10, a metal layer including molybdenum is formed on a base substrate. The metal layer is etched through a wet-etching process to form a plurality of gate lines 121 and a plurality of storage electrode lines 131. Each of the gate lines 121 has a gate electrode 124, and each of the storage electrode lines 131 has a first storage electrode 133a and a second storage electrode 133b.

Figure 11:
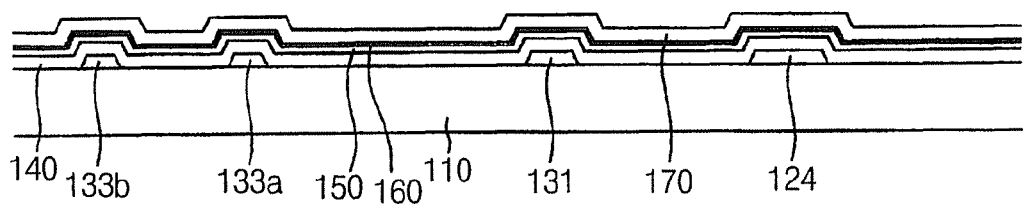
FIGS. 11, 12, 13, 14, 15, 16, 17 and 18 are cross-sectional views illustrating an exemplary embodiment of a method of manufacturing a TFT substrate according to the present invention.

Referring to FIG. 11, a gate insulating layer 140, an amorphous silicon layer 150 and an n$^+$ amorphous silicon layer 160, into which n$^+$ impurities such as phosphorous are implanted at a high concentration, are formed on the gate line 121 and the storage electrode line 131 through a PECVD method. The amorphous silicon layer 150 may include hydrogenated amorphous silicon, and the n$^+$ amorphous silicon layer 160 may include suicide, n$^+$ amorphous silicon, into which n$^+$ impurities such as phosphorous are implanted at a high concentration, or other similar substances.

A data layer 170 including molybdenum is formed on the n$^+$ amorphous silicon layer 160 through a sputtering process.

A photoresist composition is coated on the data layer 170 to form a photoresist film. In one exemplary embodiment the photoresist composition may be deposited through a spin coating method. The photoresist composition includes about 100 parts by weight of a resin mixture and about 10 parts to about 50 parts by weight of naphthoquinone diazosulfonic acid ester. The resin mixture includes a novolak resin and an acryl resin. The acryl resin may comprise about 1% to about 15% of the total weight of the resin mixture. A weight-average molecular weight of the novolak resin may be no less than about 30,000. A weight-average molecular weight of the acryl resin may be no less than about 20,000. The photoresist composition may further include an organic solvent.

Figure 12:
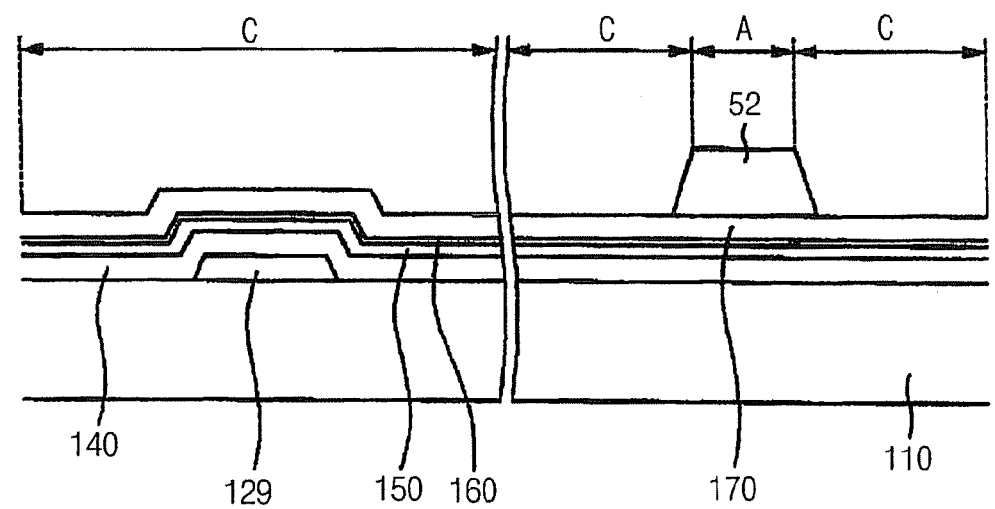
Figure 13:
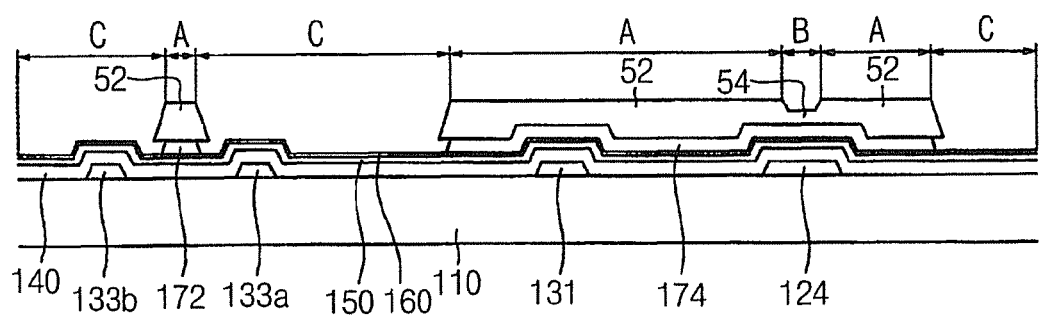

Referring to FIGS. 12 and 13, the photoresist film is exposed to light and developed to form a first photoresist pattern 52 and a second photoresist pattern 54 which is thinner than the first photoresist pattern 52.

After the photoresist patterns are developed, the first and the second photoresist patterns 52 and 54 are not heated through a post-baking process. The post-baking process may reflow the first and the second photoresist patterns 52 and 54 thereby changing their respective profiles. When the profiles of the photoresists are changed, an etching process may be hindered and a failure in a TFT may arise.

Thus, the following etching process is performed without a heating process.

Hereinafter, as shown in the cross-sectional views an area 'A' corresponds to a data line, a storage electrode, a storage electrode line, a source electrode and a drain electrode. Furthermore, an area 'B' corresponds to a channel layer, and an area 'C' corresponds to an area in which the photoresist patterns 52 and 54 have been removed.

The photoresist film is etched to form the first photoresist pattern 52 in the area 'A' and the second photoresist pattern 54 in the area 'B' and to remove a portion of the photoresist film in the area 'C'. The first photoresist pattern 52 is thicker than the second photoresist pattern 54. A thickness ratio of the first photoresist pattern 52 to the second photoresist pattern 54 may be varied in view of a manufacturing process. However, the thickness of the second photoresist pattern 54 may be no more than about 50% of a thickness of the first photoresist pattern 52.

In one exemplary embodiment the first photoresist pattern 52 and the second photoresist pattern 54 may be formed using a mask having a transparent area, a light blocking area and a semi-transparent area. The semi-transparent area may have a slit pattern, a lattice pattern, or other similar patterns. When the semi-transparent area has a plurality of slits, a distance between the slits and a width of each of the slits may be smaller than a resolution of an exposure used for an etching process, e.g. the slits used for only partially removing the photoresist pattern may be smaller than the exposure used to fully remove the photoresist pattern.

Figure 14:
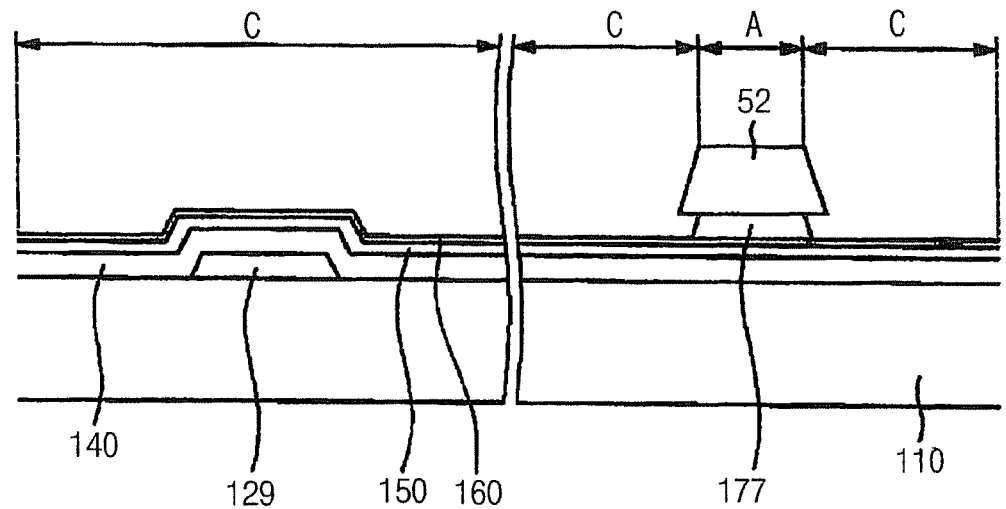

Referring to FIGS. 13 and 14, the data layer in the area 'C' is removed using the first photoresist pattern as a mask through a wet-etching process to form a first data pattern 172 corresponding to the data lines 171, a second data pattern 174 corresponding to the drain electrode 175 and the source electrode 173, and a third data pattern 177 corresponding to the end of the data line 179. The sections of the data pattern 170 not covered by a photoresist pattern are removed.

Figure 15:
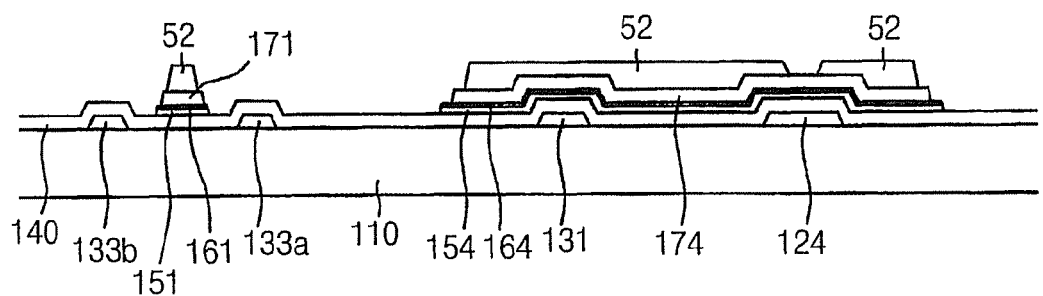
Figure 16:
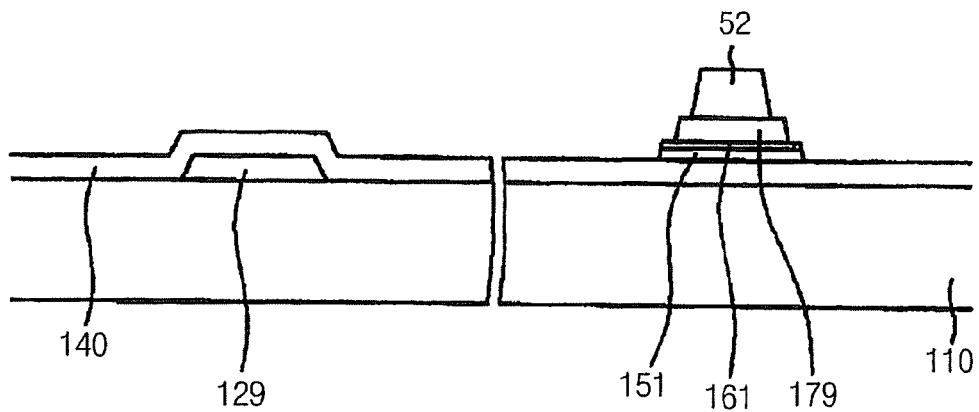

Referring to FIGS. 15 and 16 the amorphous silicon layer 150 and the n+ amorphous silicon layer 160 in the area 'C' is dry-etched using the first, second and third data patterns 172, 174 and 177 as masks to form a first amorphous silicon layer 151, a second amorphous silicon layer 154, a first n+ amorphous silicon layer 161 and a second n+ amorphous silicon layer 164.

Again referring to FIGS. 15 and 16, the second photoresist pattern 54 in the area 'B' is removed through an etching-back process. The thickness of the first photoresist pattern 52 is reduced by at least the thickness of the second photoresist pattern 54. Furthermore, ends of each of the first, second and third data patterns 172, 174 and 177 are exposed by the etching-back process.

Figure 17:
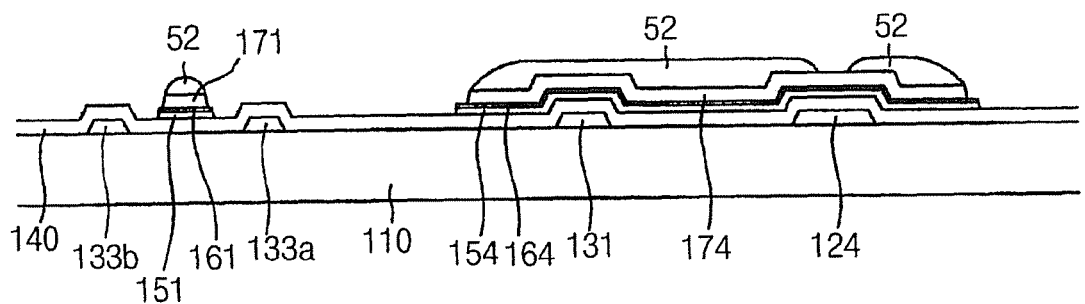

Referring to FIGS. 17 and 18, the first photoresist pattern 52 is heated at a temperature of about 100° C. to about 150° C. causing it to flow.

The photoresist composition has a relatively high heat-resistance so that a profile of each of the photoresist patterns 52 and 54 formed using the photoresist composition is not substantially varied before and after being heated.

Referring to FIGS. 19 to 21, the first data pattern 172 is etched by using the first photoresist pattern 52 as a mask to form the data lines 171. The second data pattern 174 is etched by using the first photoresist pattern 52 as a mask. The sections of the second data pattern 174 not covered by the photoresist pattern 52 are removed to form a source electrode 173 and a drain electrode 175 and to expose the second n+ amorphous silicon layer 164 between the source electrode 173 and the drain electrode 175. The third data pattern 177 is etched by using the first photoresist pattern 52 as a mask to form the end of the data lines 179.

Here, the second data pattern 174 may be etched through a dry-etching process or a wet-etching process.

The ends of each of the first to the third data patterns 172, 174 and 177 correspond to ends of the first resist pattern 52. Thus, when the second data pattern 174 is etched through a dry-etching process, portions of each of the first to the third data patterns 172, 174 and 177, which are over-etched, may be relatively small. Thus, a portion of each of the first and the second n+ amorphous silicon layers 161 and 164, which become exposed through the etching process, may be relatively small.

Adhesion between the first photoresist pattern 52 and the ends of each of the first to third data patterns 172, 174 and 177 is relatively strong. The photoresist patterns are formed from a composition which has a relatively high heat-resistance and do not exhibit substantial flow, therefore stresses caused by flowing of the first photoresist pattern 52 and the second photoresist pattern are reduced. Thus, when the second data pattern 174 is etched through a wet-etching process, a portion of each of the first to the third data patterns 172, 174 and 177, which is over-etched, may be relatively small. Thus, portions of each of the first and the second n+ amorphous silicon layers 161 and 164, which are exposed, may be relatively small.

The first photoresist pattern 52 is removed, and an exposed portion of the second n+ amorphous silicon layer 164 is removed through a dry-etching process.

Referring to FIGS. 22 to 24, a passivation layer 180 is formed to cover the data line 171, the drain electrode 175 and the gate insulating layer 140.

The passivation layer 180 is etched through a photo-lithography process to form a plurality of contact holes 181, 182, 183a, 183b and 185.

Referring to FIGS. 5 to 7, a transparent conductive material, such as ITO, IZO, or another substance with similar characteristics, is deposited on the passivation layer 180 through a sputtering process and is patterned to the pixel electrode 191, the contact assistants 81 and 82 and the overpass 83.

According to the above, a photoresist composition has a relatively high heat-resistance. Thus, when a photoresist film formed using the photoresist composition is heated, a profile variation of the photoresist film is relatively small. Therefore, a design margin may be increased, and a skew may be reduced.

Furthermore, a residual photoresist film has a uniform thickness. Thus, a short circuit and/or an open defect in a TFT substrate may be reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a thin-film transistor substrate, the method comprising:
   forming a gate line on a base substrate,
   sequentially forming a gate insulating layer, a semiconductor layer and a data layer on the gate line and the base substrate;
   coating a photoresist composition on the data layer to form a photoresist film, the photoresist composition comprising about 100 parts by weight of a resin mixture including novolak resin and acryl resin and about 10 parts to about 50 parts by weight of a naphthoquinone diazosulfonic acid ester;
   patterning the photoresist film to form a photoresist pattern;
   firstly etching the data layer by using the photoresist pattern as a mask;
   etching the semiconductor layer by using an etched data layer;
   heating the photoresist pattern to form a heated photoresist pattern after etching the semiconductor layer by using the etched data layer; and
   secondly etching the data layer by using the heated photoresist pattern as a mask.

2. The method of claim 1, wherein a weight-average molecular weight of the novolak resin is no less than about 30,000.

3. The method of claim 1, wherein a weight-average molecular weight of the acryl resin is no less than about 20,000.

4. The method of claim 3, wherein the acryl resin comprises about 1% to about 15% of the total weight of the resin mixture.

* * * * *